United States Patent [19]

McCormack et al.

[11] 4,142,207
[45] Feb. 27, 1979

[54] FERROELECTRIC IMAGING SYSTEM

[75] Inventors: Kent McCormack, Richardson; William M. Knight, Jr., Plano, both of Tex.

[73] Assignee: Texas Instruments Incorporated, Dallas, Tex.

[21] Appl. No.: 862,269

[22] Filed: Dec. 20, 1977

[51] Int. Cl.² .......................................... H01J 31/49
[52] U.S. Cl. .................................. 358/113; 250/332; 250/338; 358/213
[58] Field of Search ................ 358/113, 213; 250/330, 250/332, 333, 334, 338, 339, 340

[56] References Cited

U.S. PATENT DOCUMENTS

| | | | |
|---|---|---|---|
| 3,902,066 | 8/1975 | Roosild | 250/330 |
| 4,039,833 | 8/1977 | Thom | 250/330 |
| 4,072,863 | 2/1978 | Roundy | 250/330 |
| 4,080,532 | 3/1978 | Hopper | 250/330 |

OTHER PUBLICATIONS

H. B. Wetzell, "Solid State Infrared/Scanner Device" 12-7-67, pp. 1070-1072.

Primary Examiner—Robert L. Griffin
Assistant Examiner—Edward L. Coles
Attorney, Agent, or Firm—Rene' E. Grossman; Alva H. Bandy

[57] ABSTRACT

An improved ferroelectric imaging system comprises a chopper, lens system, ferroelectric detector matrix, switching matrix, drive and readout electronics, video processor and display. The chopper interrupts infrared energy emanating from a scene, and the lens system focuses the chopped infrared energy on the ferroelectric detector matrix which produces electrical signals representative of the impinging infrared energy. The signals are read out by the drive and read out electronics whose action is synchronized with the chopper action, processed in the video processor and displayed by the display. The ferroelectric matrix comprises a plurality of detector capacitor elements fabricated by forming a metal surface on the upper surface of a dielectric of ferroelectric material and a plurality of metal pads arranged in rows and columns on its lower surface. Said metal plate forming the upper plates for the capacitors and the metal pads forming the lower plates. The upper plate is connected to busbars for biasing. The switching matrix includes a plurality of solid state switches arranged in rows and columns. The switches have elements operatively connected to the lower plates of the detector capacitor elements, a sense line for each row, and x and y address lines of the drive and readout electronics. The drive and readout electronics action is synchronized with the chopper action to provide the sense line with a signal representative of the infrared energy impinging sequentially on each detector capacitor element for processing and display.

7 Claims, 29 Drawing Figures

FERROELECTRIC IMAGING SYSTEM

This invention relates to thermal imagers, and more particularly, to an improved ferroelectric imaging system.

In the past, ferroelectric imager systems have included a lens system, a dectector matrix, drive and read out electronics, a video processor, a timing and control means and a display means. The detector matrix includes a slab of ferroelectric material having orthogonal lead patterns formed respectively on opposing major surfaces of the ferroelectric material. The intersection of the orthogonal lead patterns, which constitutes plates, together with the ferroelectric material, which constitutes a dielectric, form capacitor type elements which make up the detector matrix. The capacitors are temperature dependent and are the basis for the ferroelectric transducer. So constructed, the detector elements of the detector matrix are in rows and columns. The detector matrix is positioned within the housing so that all but one row are in front of the lens system to receive the infrared energy passing therethrough. The remaining row is shielded from infrared energy passing through the window to provide a row of reference detector elements.

The detector matrix is coupled to the drive and read out electronics. The drive electronics include a scan multiplexer and a pair of sine wave signal generators. The reference row of detector elements are connected to a first one of the sine wave signal generators while the remaining rows of detector elements are connected to the second of the sine wave signal generators through a switch and multiplexer. The read out electronics comprises preamplifiers connected to the columns of detector elements and whose outputs are connected to a signal multiplexer. The signal multiplexer is connected to the video processor which is connected to the display.

In this arrangement the IR lens system focuses infrared image of a scene onto the detector matrix. Then, the drive scan multiplexer, upon command of the timing and control means, connects sequentially the second sine wave generator to the rows of detector elements. The generator output charges in turn each row of detector elements. The charge of each detector element of each row is varied by the intensity of thermal energy impinging thereon. The reference detector elements connected to the columns of detector elements are charged by the generator. The signal multiplexer of the read out electronics, upon command of the timing and control mechanism, sequentially connects each element of a row of detector elements to the video processor. The output signals of the reference elements are combined with the outputs of the rows of detector elements and signals equal to the difference of the charges are produced for amplification by preamplifiers decoded by a decoder and passed through the video processor. The read out multiplexer similarly connects sequentially the detector elements of the detector to produce the video signals representative of the scene for display on the cathode ray tube. The above described ferroelectric imaging system is more fully described in U.S. Patent Application Ser. No. 796,785, filed May 13, 1977, now U.S. Pat. No. 4,080,532.

The prior art system suffers many disadvantages. Examples of disadvantages are: shunt capacitance which exists along any column of detector elements because of the capacitance of each detector element along that column and in a nonaddressed row; a fixed pattern noise which exists because of element to element capacitance uniformity; and a thermal short which can exist between the detector element and the substrate because support thermal impedance is not provided.

Still other disadvantages exist, when the upper capacitor surfaces are used as the sense lines, the sense lines must be ball bonded down off the upper detector surface to the individual preamps or to individual switches. The multiball bonds are undesirable because of yield and technique complexity. Also the sharing of a single preamp to reduce the number of preamplifiers is objectional because of the magnitude of the parasitic capacitance. Further, the conductive strip forming the sense line has the electrical characteristics of a transmission line; these characteristics restrict the speed with which any one line or detector can be addressed.

Accordingly, it is an object of the present invention to provide an improved ferroelectric imaging system.

Another object of the invention is to provide a ferroelectric imaging system which is both easy and economical to fabricate.

Another object of the invention is to alleviate the shunt capacitance along any column of detector elements and to reduce substantially any fixed pattern noise.

Still another object of the invention is to eliminate substantially the possibility of thermal shorts existing between the detector matrix and its substrate or support member.

Yet another object of the invention is to eliminate the necessity for multi-ball bonds to bond the sense lines to the preamps.

Still yet another object of the invention is to increase the speed with which any one line or detector can be addressed.

Briefly stated, the invention comprises an improved ferroelectric imaging system which includes a chopper, a lens system and a housing with a window, a temperature controlled heat sink, a silicon switching matrix, an anisotropic ferroelectric heat sink, and an improved detector matrix means. The window is mounted in one end of the housing in optical alignment with the chopper and lens system. The temperature controlled heat sink is mounted in the end of the housing opposite the window bearing end. The temperature controlled heat sink supports within the housing the silicon switching matrix on top of which is formed the anisotropic heat sink which in turn supports the detector matrix in a spaced relationship to the window. The space between the ferroelectric wafer and window comprises a vacuum or a dry inert atmosphere.

The novel features believed to be characteristic of this invention are set forth in the appended claims. The invention itself, however, as well as other objects and advantages thereof may best be understood by reference to the following detailed description of illustrative embodiments when read in conjunction with the accompanying drawings in which:

FIGS. 6a–6d show the fabrication of the anisotropic heat sink of FIG. 5a;

Figure 1:
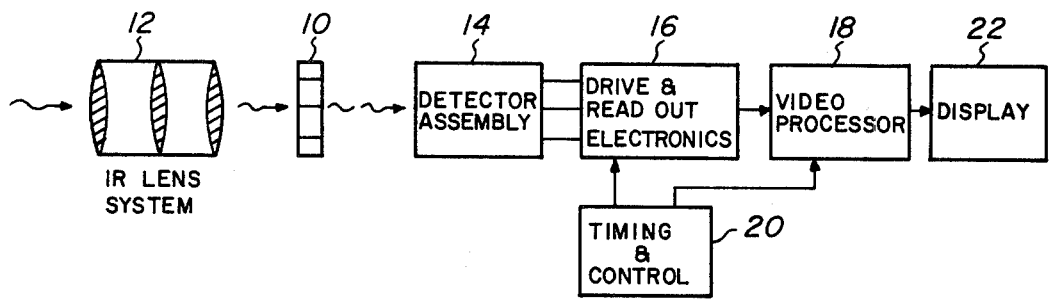
FIG. 1 is a block diagram of the improved ferroelectric imaging system.

Referring now to FIG. 1, the thermal imager system comprises an infrared energy chopper 10, lens system 12, detector assemby 14, drive and read out electronics 16, video processor 18, timing and control means 20, and display means 22. The chopper 10 is, for example, a mechanical chopper for interrupting the flow of infrared energy to the surface of detector matrix of the detector assembly 14. The lens system 12 may be, for example, an infrared lens system having an object lens, correction lens, and focusing lens for focusing thermal energy emanating from a scene (not shown), which is chopped by the chopper 10, onto the detector matrix of the detector assembly 14. It will be understood by those skilled in the art that various types choppers and lens systems exist capable of performing the desired optical functions. The detector matrix of the detector assembly 14 includes a plurality of thermal energy sensors for producing electrical signals representative of the thermal energy impinging on the sensors for the video processor 18. The detector matrix of the detector assembly 14 is more fully described hereinafter. The video processor 18 processes the signals representative of the scene into display signals for display by the display means 22. The display means 22 may be, for example, a cathode ray tube, and the video processor 18 is that used for processing electrical signals into a TV format. The drive and read out electronics 16 is connected to the detector matrix of the detector assembly 14 for biasing the thermal sensors and reading out electrical signals representative of the scene. The timing and control mechanism 20 guides the action of the chopper 10, drive and read out electronics 16 and video processor 18 to selectively produce signals of the scene in a desired format for display by display means 22.

Figure 2:
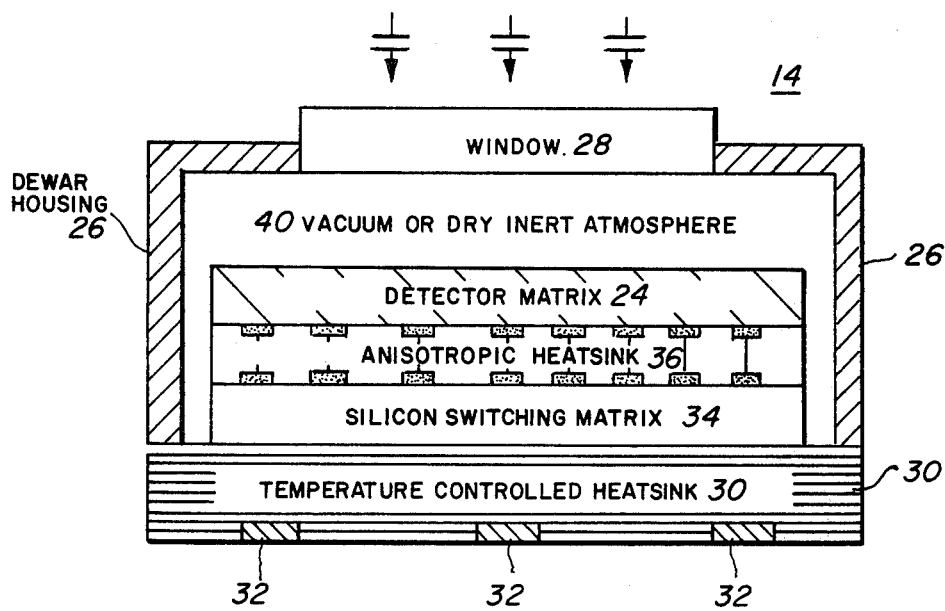
FIG. 2 is a cross-sectional view of the detector mechanism for the ferroelectric imaging system.

Referring now to FIG. 2 for a description of the detector assembly 14 used in the ferroelectric imaging system, the detector assembly 14 comprises housing 26 which may be, for example, a stainless steel housing having a window 28 formed in one major surface. The window, for thermal energy, may be of, for example, a variety of glasses, for example, silicon, chalcogonide, etc., which transmit from the near IR through gamma rays, and germanium or indium which transmit, respectively, in the 8–14 micron and 35 micron infrared wavelengths. The window 28 is positioned in the light or thermal path to the detector matrix 24. A heat sink 30, which may be, for example, a ceramic substrate of beryllium oxide, closes the other end of housing 26. Heating elements 32 are connected to a source of power (not shown) for controlling the temperature of the heat sink 30. A switching matrix 34, which may be, for example of silicon, is mounted on the temperature control heat sink 30. An anisotropic heat sink 36 is formed on the silicon switching matrix 34, and the detector array or matrix 24 is mounted on the anisotropic heat sink 36. A space 40 which may be, either a vacuum or a dry inert atmosphere is provided intermediate the detector matrix 24 and window 28. The silicon switch matrix 34, anisotropic heat sink 36 and the detector matrix 24 will be described hereinafter in detail.

Figure 4:
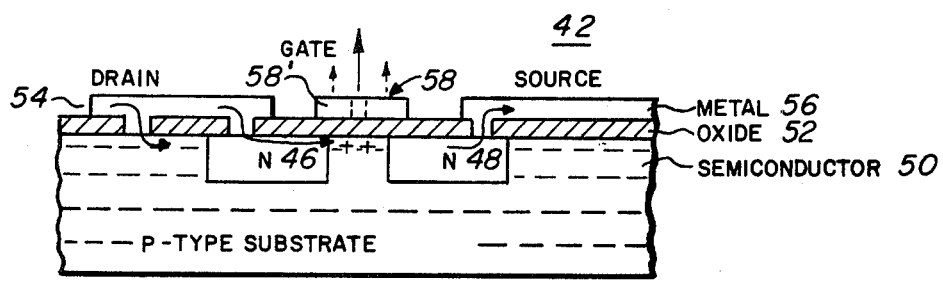
FIG. 4 is a cross-sectional view of a field effect transistor forming the switching matrix of the ferroelectric imaging system.

The silicon switching matrix 34 (FIG. 2), in one embodiment, comprises a plurality of solid state switches 42 (FIG. 3), which may be, for example, field effect transistors (FET). A FET switch 42 (FIG. 4) is provided for each element 44 of the detector matrix 24. The silicon switching matrix of FET switches 42 are made by diffusing for each switch two N-regions called the drain 46 and the source 48, side by side into the surface of a P-type silicon slice 50. A layer of silicon oxide 52 is grown over the surface. A pad 54 and strip 56 of metallization are made to penetrate through windows in the oxide 52, to contact the silicon 50. A third metal strip 58, the gate, lies on top of the oxide 52, over the gap between the N-regions. In another embodiment the gate 58 is a dual gate 58 and 58' the ends of which are the dashed lines of FIG. 4. FET's so constructed are of the enhancement type, referring to the increase of working-current conduction by the control voltage applied to the gate. That is the switch is off until a voltage is applied to the gate. The drain pads 54 form the base for the conducting rods of the anisotropic heat sink. As the methods of fabricating FET switches in matrix format are well known to those skilled in the art, the techniques are not described in further detail.

Figure 5A:
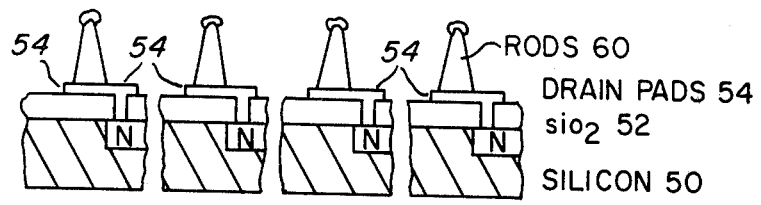
FIGS. 5a–5c are cross-sectional views of the anisotropic heat sink configurations of the ferroelectric imaging system.
Figure 5B:
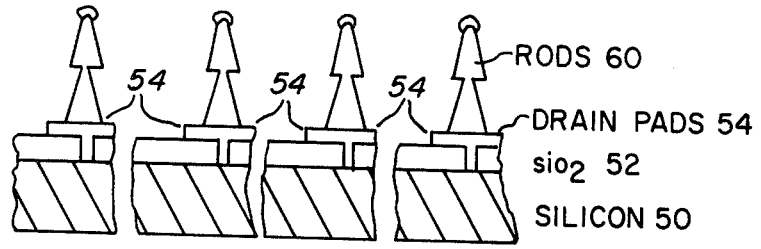
Figure 5C:
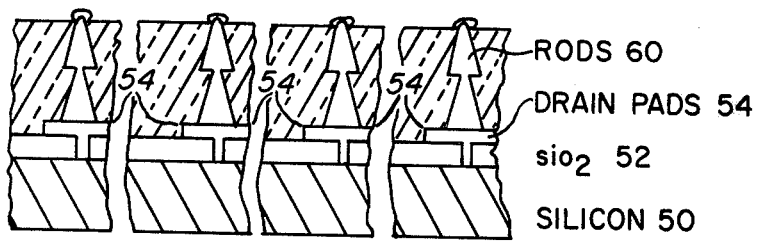

The anisotropic heat sink 36 (FIG. 2), shown in FIGS. 5a–5c, comprises a vacuum surrounding a plurality of spaced conductor rods 60 formed on the drain pads 54 of the FET switches 42. The electrical resistance of the conductor rods or leads 60 must be low; while on the other hand the thermal resistance must be high. This is necessary as the thermal conductivity of silicon in which the FET switches 42 are formed is high and acts as a thermal short between the detector elements 44 if a thermal impedance is not provided. Thus, the thermal resistance of the conducting rods 60 is the dominant factor in terms of importance. The thermal conductivity is defined by the expression for perpendicular heat flow through a surface; that is, $$H = kA \, (\delta T/\delta n)$$

where:
H = heat
k = conductivity
A = cross sectional area of the conducting rod
$\delta T/\delta n$ = temperature gradient at the surface.

For purposes of discussion, the expression can be simplified to:

$$H = -K\Delta T$$

where:
K = thermal conductance of the element and is given by:

$$K = kA/L$$

where:
L = length of the conducting rod over which the temperature difference is measured and ΔT is the temperature difference.

From the last formula it is evident that two ways exist to achieve effective low thermal conductance. First, the K is made small by choice of materials; secondly, the aspect ratio, A/L, is made small by fabrication techniques. As the range of values of k is rather restricted because of the electrical conductivity and fabrication techniques, the second way is preferred. The same conclusion is supported by the total conductivity formula:

$$K_e = K_c + K_i = k_c(A_c/L) + k_i(A_e-A_c)/L$$

where the subscripts e, c and i refer to the total detecting element regions, conducting region, and insulating region, respectively. As $k_i$ can be made much less than $k_c$, the requirement for low $K_e$ can best be met by having the aspect ratio, $A_c/L$, very small. Thus, by keeping the cross sectional area of the conducting rods small as compared to the length, the aspect ratio of the conducting rod of each detector element will be small. For example, where the anisotropic heat sink is a vacuum and the detector center to center spacing is four mils, a conducting rod that is one mil in length and 0.16 square mils in cross sectional area has a factor of 100 reduction in thermal conductance, $K_e$.

Figure 6A:
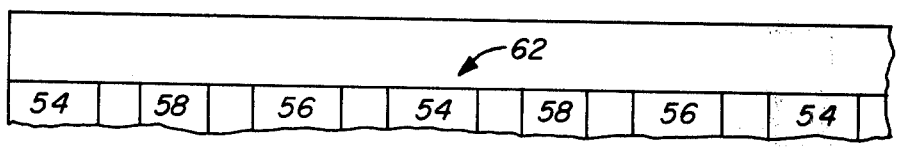
Figure 6B:
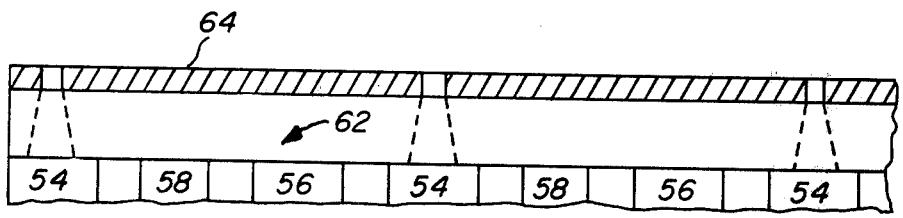
Figure 6C:
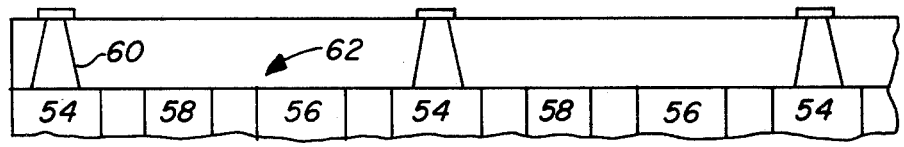

Referring now to FIG. 6a, the drain pads 54, gates 58, and source pads 56 are coated with a suitable conductor rod defining material 62 such as, for example, a photoresist sold under the trademark RISTON M811 by E. I. duPont de Nemours & Company. Next, a mask 64 (FIG. 6b) is placed over the layer of photoresist 62 and the photoresist exposed to ultraviolet light. After exposure, the image of the mask is developed and the photoresist areas not exposed to light are removed, leaving the source pads 54 bare in those areas. Next the conducting rods 60 (FIG. 6c), which may be, for example, nichrome, nickel, or gold, are formed either by vacuum deposition or electroplating. Vacuum deposition can be used if the height for given operation is small, for example, 0.05 mils. However, even this height requires many operations and the possibility of opens is high. Hence, electroplating is preferred, even though the selection of materials for the conducting rods is reduced and the application of a negative potential to the drain pads 54 is difficult.

Figure 6D:
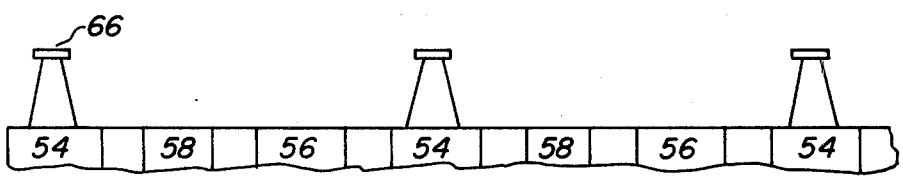
Figure 6E:
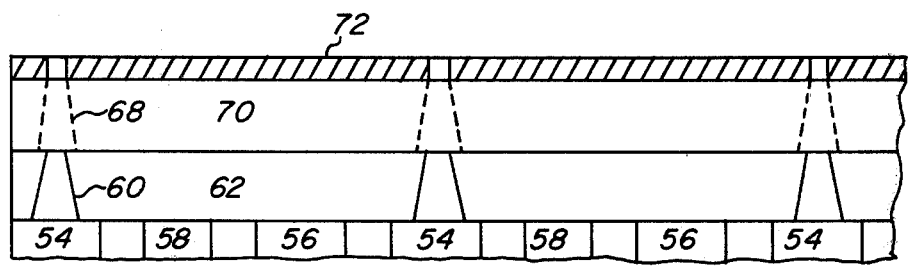
FIGS. 6e–6g show the fabrication of the anisotropic heat sink of FIG. 5b.
Figure 6F:
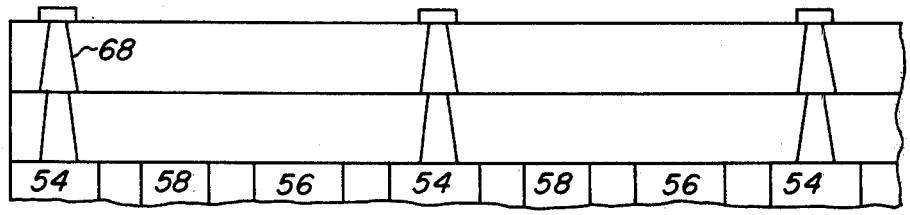
Figure 6G:
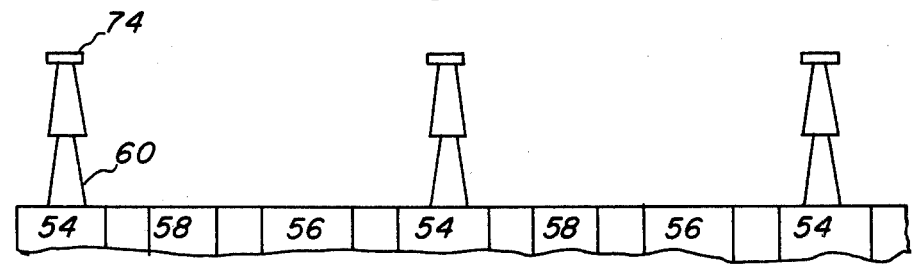
Figure 6H:
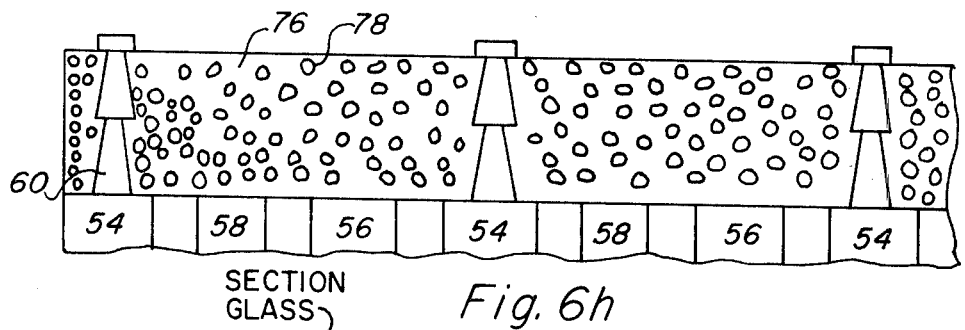
FIGS. 6h–6i show the fabrication of the anisotropic heat sink of FIG. 5c.
Figure 6I:
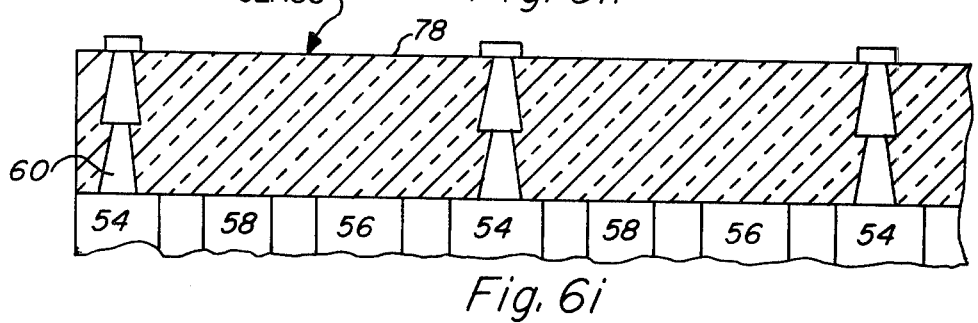

For electroplating the negative potential relative to the potential of the bath is, for example, applied to the pads 54 by turning on the resistors. Another approach is to use an alternate metal mask in lieu of the drain defining pads 54. In this technique the entire surface is metalized prior to the application of the photoresist to form an electrode with a contact at the edge of the chip. The photoresist pattern is then laid down and the rods built up by electroplating. The rod tips or pads 66 (FIG. 6d) are then polished, if necessary, to make them smoother and of more uniform heighth and the photoresist removed. If the metal surface electrode technique is used the metal between the conductor rods 60 is etched away. This method of fabrication is advantageous where the rod thickness provides the mechanical strength necessary to support the detector structure.

Where the length of the conductor rods 60 is such that the photoresist pattern cannot be made with the required rpd diameter, multiple depositions are used (FIG. 6e). For each additional rod segment 68 the rod pads 66 (FIG. 6d) are removed and an additional layer 70 of a photoresist (FIG. 6e) is applied. The layer 70 is masked with a mask 72. To facilitate alignment of the rod patterns, the mask rod diameters are made slightly larger than the ends of the conducting rods 60. Thus, when aligned the rod defining rings will be seen one within the other. The photoresist 70 is then exposed by ultraviolet light and the exposed photoresist removed to form the pattern for rod segments 68. The rod segment 68 (FIG. 6f) are then formed by electroplating as previously described. The tips or pads 74 (FIG. 6g) are then polished, if necessary, to make them smooth and of uniform height. After polishing the photoresist is removed.

Where the mechanical strength of the conducting rods 60 is insufficient to support the detector matrix 24, a glass filled photoresist 76 (FIG. 6h) is used as a back fill about the conductor rods 60. The photoresist is then exposed by ultraviolet light and the photoresist removed to leave the glass particles 78 in place. The glass particles 78 are then sintered by backing in an oven to imbed the conducting rods 60 (FIG. 6i) and provide the mechanical strength necessary to support the detector structure.

Figures 7A, 7B, 7C:
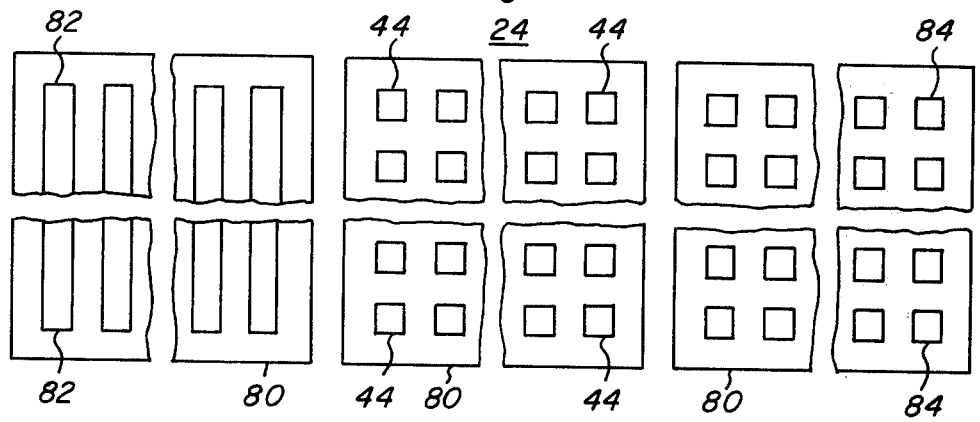
FIGS. 7a–7c depict fabrication of one embodiment of the ferroelectric detector matrix.

The detector matrix 24 (FIG. 7b) comprises a wafer of ferroelectric material 80 having longitudinal lead patterns 82 (FIG. 7a) and pads 84 (FIG. 7c) formed on opposing major surfaces by evaporation/etching techniques. The leads 82 are column leads formed on the top surface of the ferroelectric wafer 80 and the pads 84 are leads formed on the lower surface of the ferroelectric wafer 80. The pads 84 and the crossover portions of the lead patterns 82 together with the ferroelectric material 80 form the elements of the detector matrix 24. The resulting detector matrix 24 is a plurality of capacitor type thermal sensors 44 represented by the squares of FIG. 7b.

The ferroelectric wafer 80, i.e., a material having dielectric properties, preferably is one having a Curie temperature near ambient temperature (0° to 150° C.) such as, for example, barium titanate ($BaTi_2O_3$), triglycenesulfate (TGS), barium strontium titanate, lead titanate, potassium dihydrogen phosphate, and Rochelle salt. Barium titanate, which has a Curie temperature of about 125° C., is preferred.

Whichever ferroelectric material 80 is selected it must be used near its Curie temperature, i.e., the temperature above which a ferroelectric material ceases to be spontaneously polarized. Above the Curie temperature, barium titanate is a cubic crystal structure strongly susceptible to polarization. Thus, its dielectric constant is a strong function of the temperature. On the other hand at temperatures well below the Curie temperature ferroelectric material exhibits a spontaneous dipole moment. This produces an internal electric field and surface charges then accumulate to quench the field. As the degree of polarization is temperature dependent, operation well below the Curie temperature is the basis for the pyroelectric vidicon which is not a part of this invention.

Figures 8A, 8B, 8C:
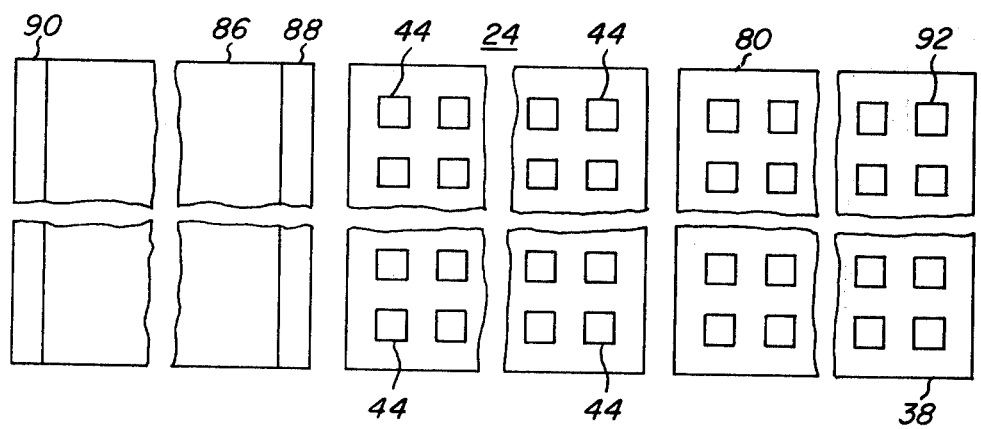
FIGS. 8a–8c depict fabrication of a second embodiment of the ferroelectric detector matrix.

Referring now to FIGS. 8a–8c, another embodiment of the detector matrix 24 is disclosed. In this embodiment the electromagnetic wafer 80, which may be that of FIG. 7b, has its upper surface plated with a metal conductor 86 (FIG. 8a). The metal conductor 86 is in electrical contact with bus bias leads 88 and 90. Biasing leads 88 and 90 are disposed adjacent opposite edges of the plate 86 for connection to a source of bias current for charging the upper plate 86. Metal pads 92 (FIG. 8c) are deposited on the lower surface of the ferroelectric wafer 80. Metal pads 92, together with the ferroelectric wafer 80 and the upper plate 86 form the elements 44 of the detector matrix (FIG. 8b).

Figure 9:
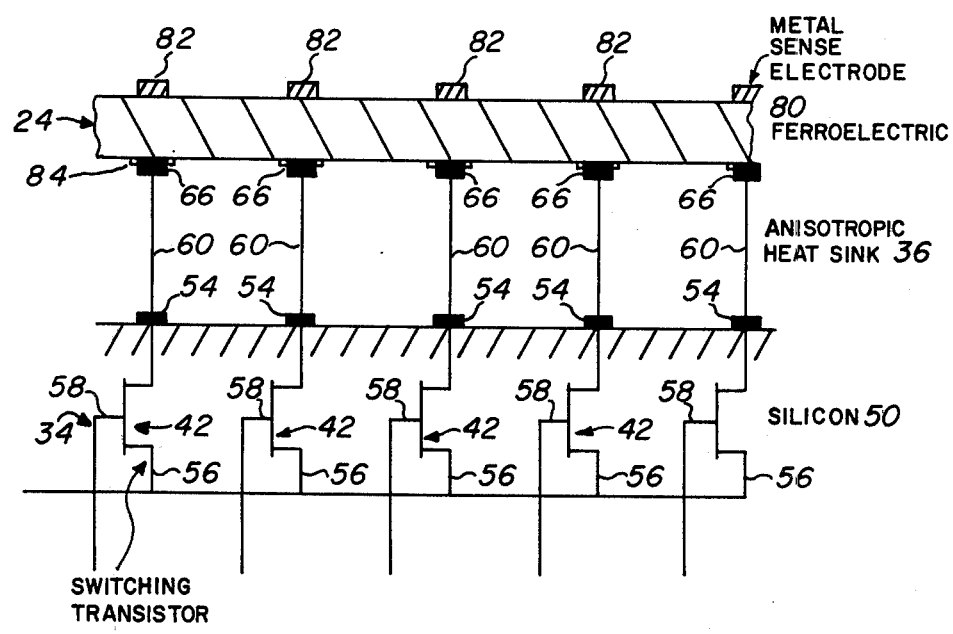
FIG. 9 is a view, partly in cross section, of one embodiment of the detector mechanism with the housing removed.

The combination of the detector matrix 24, anisotropic heat sink 36 and switching matrix 34 for the first embodiment is shown in FIG. 9. The conducting rods 60 of the anisotropic heat sink 36 are grown on the drain pads 54 of the switching matrix switches 42. The tips or pads 66 of the conducting rods 60 are attached, for example, by bump bonding to the lower pads 84 of the detector matrix 24. The stripes 82, which also form the sense lines, are connected to the inputs of the amplifiers by ball bonding, for example.

Figure 3:
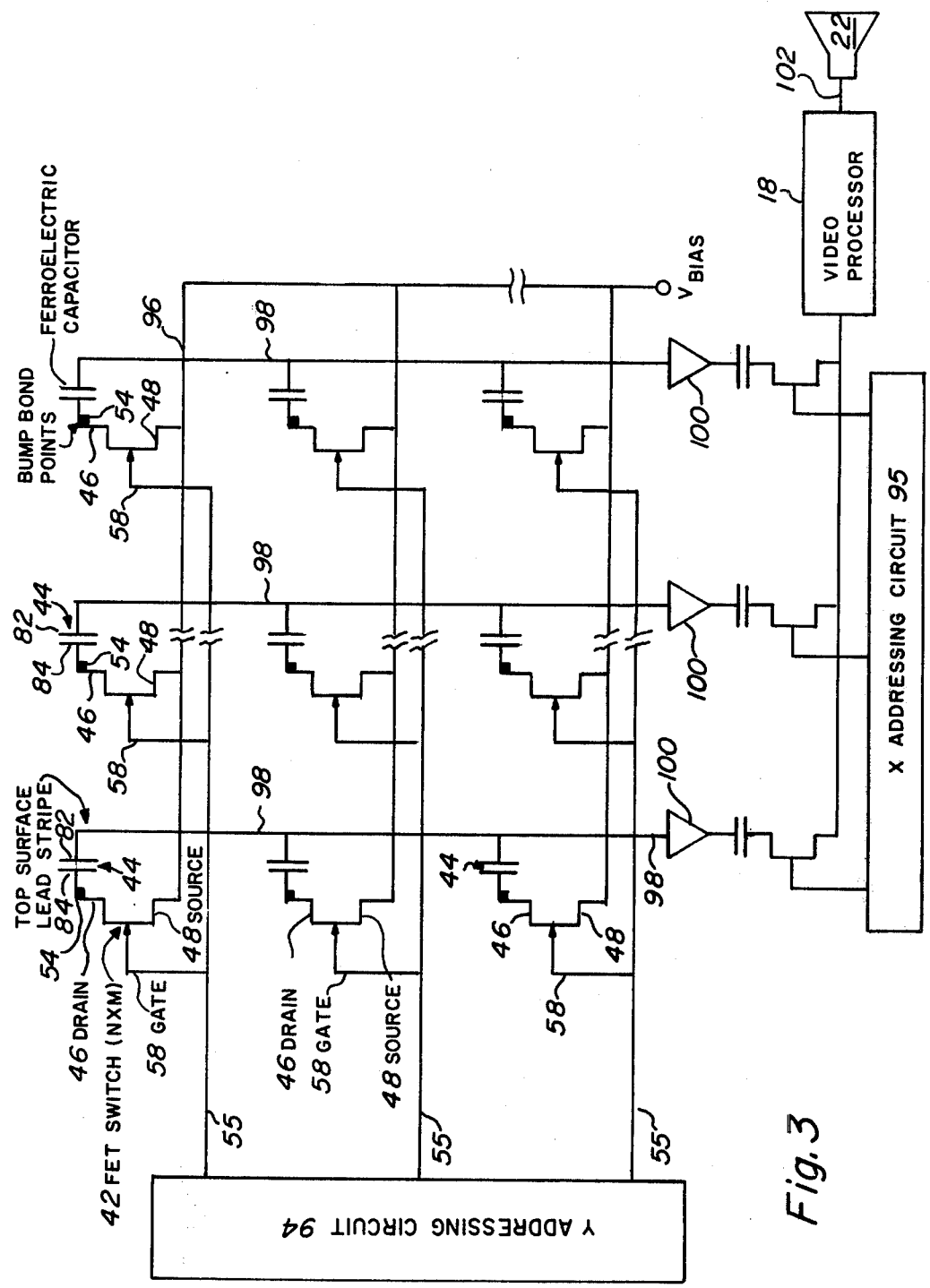
FIG. 3 is a view, partly schematic, showing one embodiment of the ferroelectric imaging system.

Referring now to FIG. 3, the FET switches 42 of each row have their gates 58 connected by leads 55 to a row (y) address circuit 94 and their sources 48 connected by leads 96 to a biasing ($V_{Bias}$) source of power. The FET switches 42 have their drains 46 connected by the anisotropic heat sink connecting rods 60 to the lower lead stripes or plates 84 of the ferroelectric capacitors 44 forming the detector matrix 24. Each lower lead 84 interconnects a column of capacitors. The upper lead stripes or plates 82 of each column of capacitors 44 are ball bonded to leads 98 which are connected to preamplifiers. The preamplifiers 100 are multiplexed by an x addressing circuit 95 to read the amplified electrical signals of each capacitor 44 to the video processor 18. The output of the video processor 18 is connected by lead 102 to the display 22.

Figure 10:
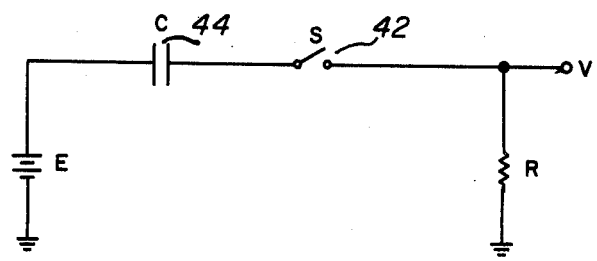
FIG. 10 is the electrical equivalent circuit of the detector matrix embodiment of FIG. 9.

In operation, the y addressing circuitry 94 provides a high voltage to the gates 58 of row one switches 42 and a low to the gates of the other rows of switches. The high voltage, applied to gates 58, turns on the switches 42 of row one to charge the ferroelectric capacitors 44 to a voltage (E) (FIG. 10) through a resistor R. At the turn on time the chopper 10 (FIG. 1) is sequentially interrupting the infrared energy emanating from the scene and impinging on the capacitors 44. The FET switches 42 (FIG. 3) of row one are turned off sequentially at the time the chopper is admitting the infrared energy sequentially (from left to right) to the ferroelectric capacitors 44 and their capacitance is changed in proportion to the infrared energy impinging thereon ($V_c$). Then just before the chopper sequentially interrupts the infrared energy again the switches 42 of row one are closed and the x addressing circuit 95, which is synchronized with the chopper, sequentially addresses each capacitor 44 of row one. Each capacitor discharges down to the voltage E (FIG. 10) which is supported by the biasing voltage applied by the closing of the switches 42. The output, therefore, is equal to the intensity of the infrared energy impinging on the capacitors. ($V = E V_c$). Since $V_c$ is the voltage across C just before the switch was closed $V_c = Q(a)/c(Y)$ where Q(o) is the original charge placed on C, and C(Y) is the C value at time (Y). Further, Q(o) = EC(o), thus V = E − E C(o)/C(Y) or V = E[C(Y) − C(o)/C(Y)].

The outputs on lines 98 are individually buffered by the preamplifiers 100, multiplexed by the x addressing circuit 94 and processed in the video processor 18 to provide single line video corresponding to the signal level for each capacitor 44 in the row for display by display 22. The process is repeated for each row of the detector matrix 24. It will be appreciated that the resulting single line video information is of positive polarity on the first frame and of negative polarity on the second frame. An external polarity reversing circuit (not shown) is used to invert the polarity of all the negative polarity frames.

Figure 11:
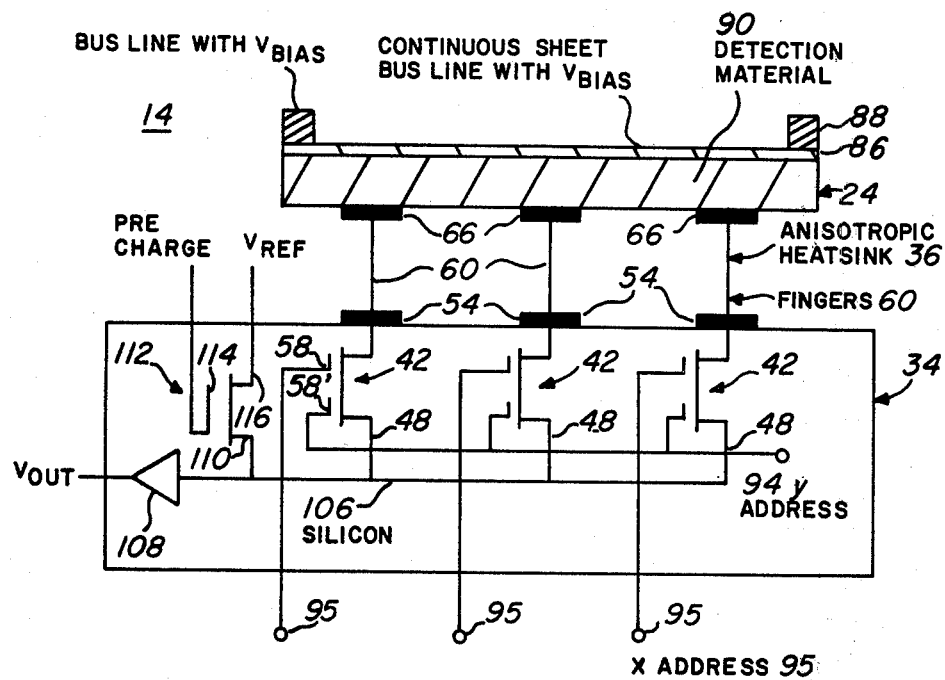
FIG. 11 is a view, partly in cross section, of a second embodiment of the detector mechanism with the housing removed.

Referring now to FIG. 11, for a description of a second embodiment of the detector assembly 14 of the ferroelectric imaging system, the detector matrix 24 is that shown and described above in connection with FIGS. 8a–8c. The detector matrix 24 is attached, for example, by ball bonding to the tips or pads 66 or 74 of the conducting rods 60 of the anisotropic heat sink 36. The conducting rods 60 are built up from the drain pads 54 and the FET switches of the switching matrix 34 have their drains connected one on one to the detection elements of the detector matrix 24. The gates of the FET switches 42 are dual gates 58 and 58'; gates 58 are connected by columns to the x address circuit 95 and gates 58' are connected by rows to the y address circuit 94. The source 48 of the FET switches 42 are connected by rows by leads 106 to buffer amplifier 108 and to drains 110 of precharge FET switches 112. The gates 114 of the precharge FET switches 112 are connected to precharge voltage sources, and the sources 116 of these switches are connected to a reference voltage. The housing 26 and temperature controlled heat sink 30 (FIG. 2) are also used for the embodiment shown in FIG. 11 and are not shown.

Figure 12A:
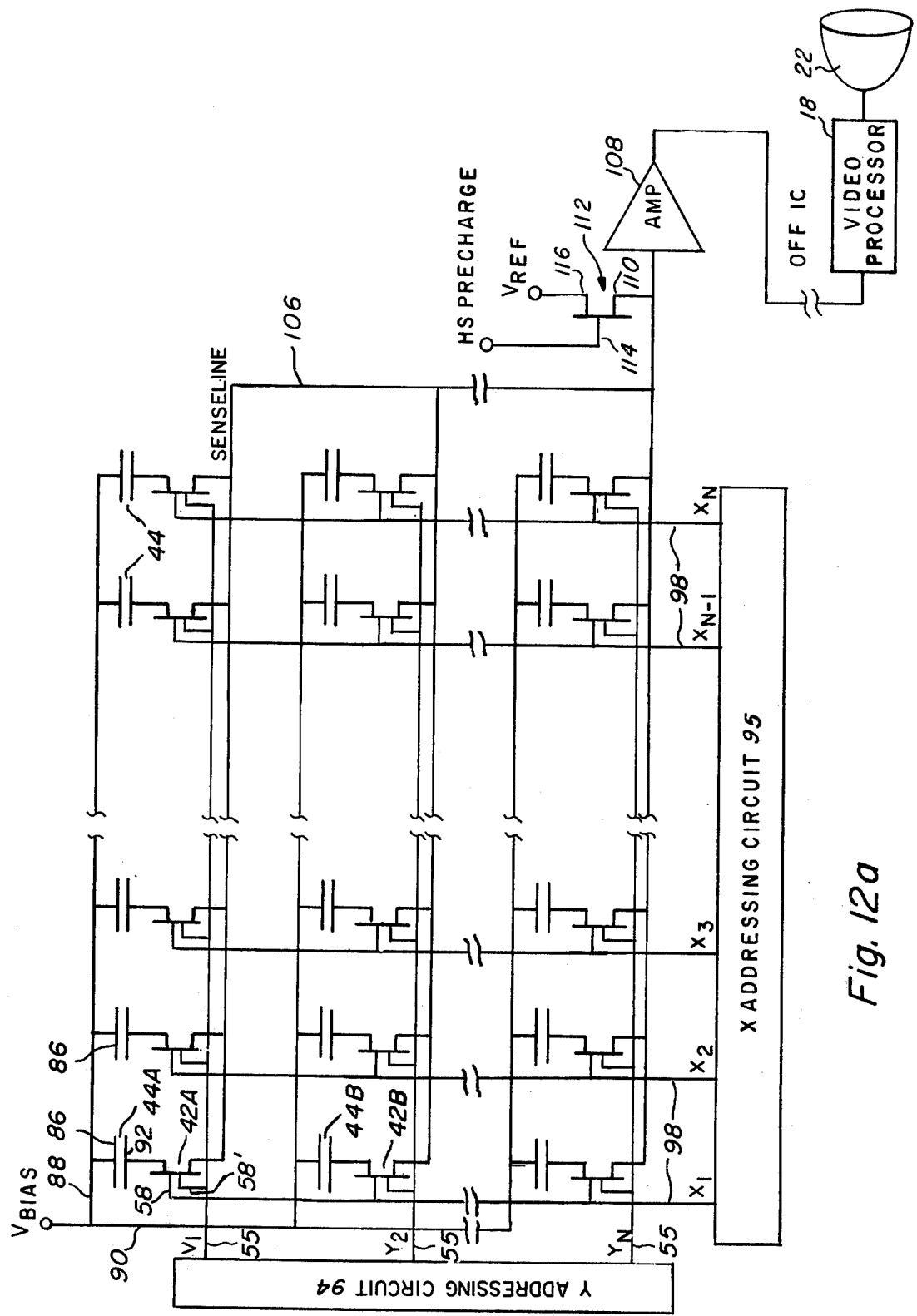
FIGS. 12a–12c are views, partly schematic of configurations of the second embodiment of the ferroelectric imaging system.
Figure 12B:
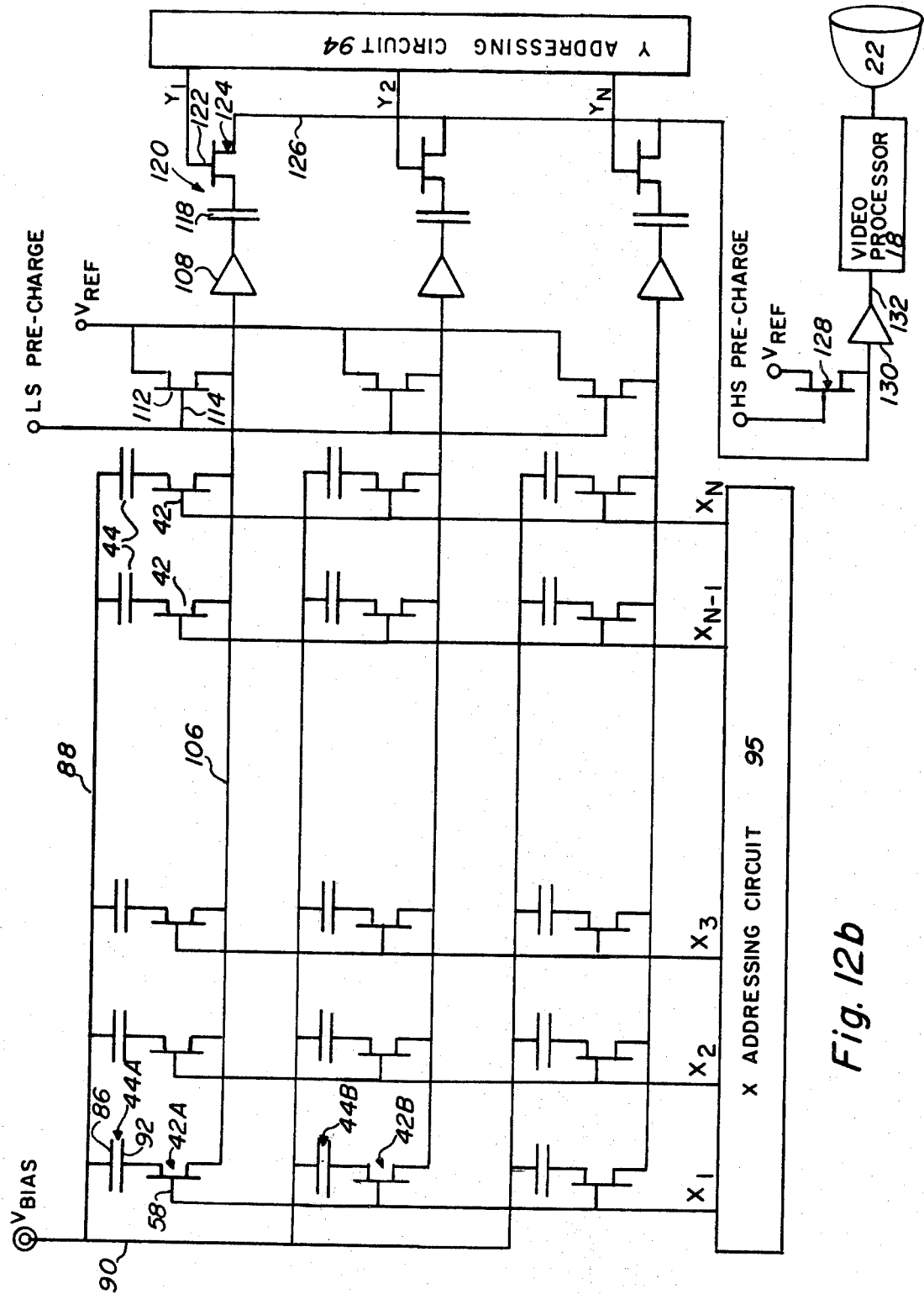
Figure 12C:
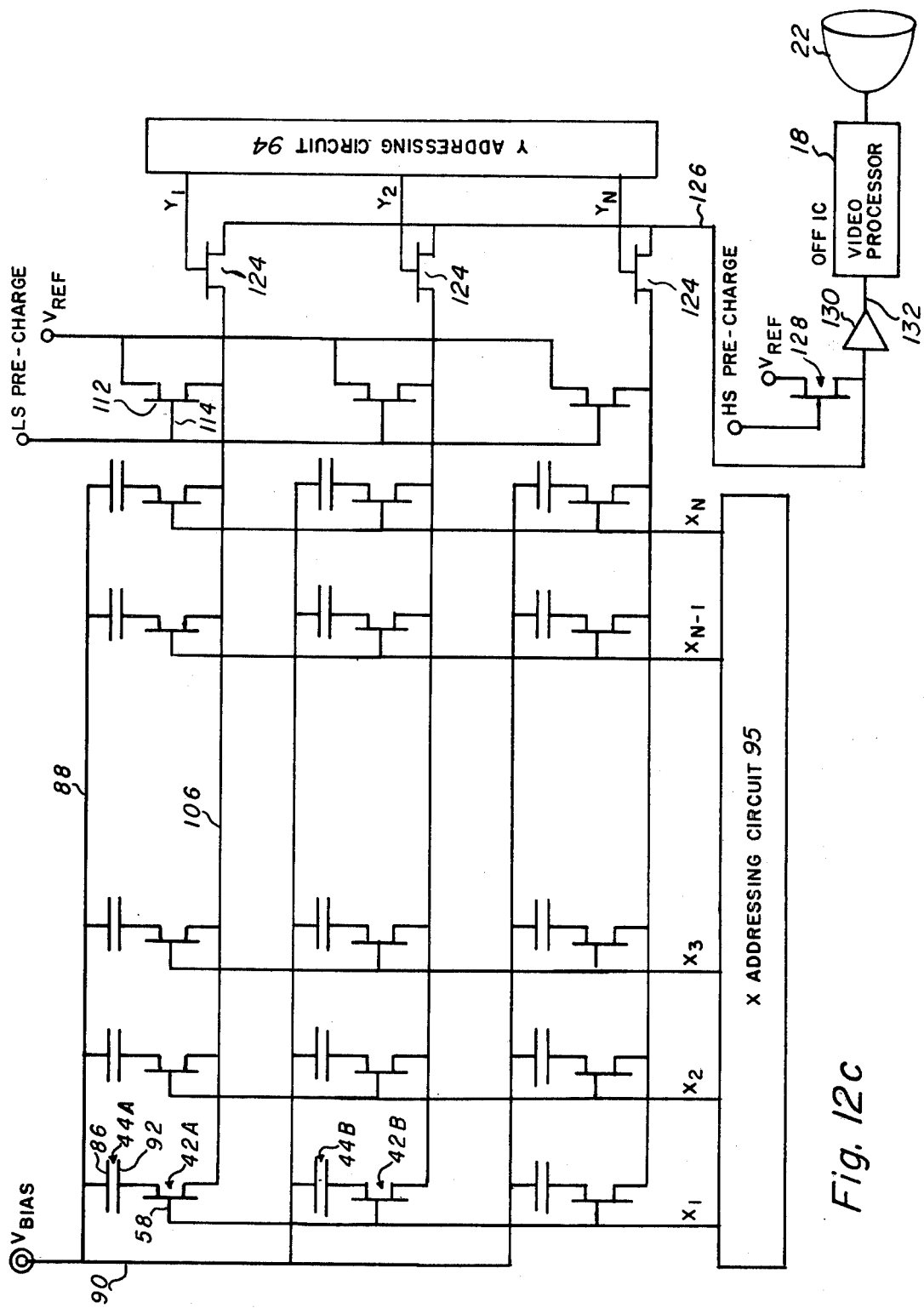

Referring now to FIG. 12a–12c for three configurations of a second embodiment of the ferroelectric imaging system. In each case the x lines 98 and y lines 55 are addressed synchronously with the x lines 98 being the low speed lines. The infrared energy emanating from a scene is chopped by chopper 10 (FIG. 1). The chopper edge 10 is moving in the x direction. The action of the chopper causes each detection element of the detector matrix 24 to be either heated or cooled according to the difference in the scene radiance for that particular detection element. The heating or cooling cycle causes a change in that capacitor element which is to be sensed and converted to video by the switching matrix 34. The change in capacitance will be at its maximum for each element as the chopper edge passes that element. Hence, the sampling process of the switching matrix is synchronized to the passage of the chopper.

Referring to the configuration of FIG. 12a, each ferroelectric capacitor 44 is x and y addressed by two gates 58 and 58' of its corresponding FET switch 42 beginning with the switch 42A and capacitor 44A in the upper left corner. At system start up the $x_1$ line 98 is addressed as the chopper moves by to turn on gates 58 of the switches 42 in column $x_1$. Once these gates 58 are turned on then the $y_1$ line 55 is addressed and gates 58' of row $y_1$ are turned on. At this time there is a low resistance path from the drain of switch 42A through line 106 to the buffer amplifier 108. When the low resistance path is established to the buffer amplifier, the high speed precharge FET switch 112 is pulsed to establish reference voltage $V_{ref}$ on the sense line 106. This switching action establishes a voltage of ($V_{ref} - V_{bias}$) across the ferroelectric capacitor. Then, the high speed precharge switch 112 is turned off and the $y_2$ line 55 addressed and the precharge switch action repeated to establish the voltage ($V_{ref} - V_{bias}$) across the capacitor 42B. This x-y addressing sequence is repeated until all of the y lines 55 have been activated and the leading edge of the chopper has moved to the $x_2$ line 98. At this time the $x_2$ line 98 is charged and the y lines 55 multiplexed for precharging the detector elements of the $x_2$ line. The process is continued until all the detector elements have been preset.

Once all of the detector elements have been preset in sequence and the next leading edge of the chopper has reached the position corresponding to the $x_1$ line 98, the read-out cycle begins. The $x_1$ line 98 is multiplexed on and the high speed precharge switch 112 is pulsed. This charges all the parasitic capacitances on the sense line 106 to $V_{ref}$. Then the high speed precharge switch is turned off to isolate the sense line 106. The $y_1$ line 55 is then addressed to establish the low resistance path again from the drain of switch 42A through the sense line 106 to the buffer amplifier 108. It will be appreciated that there has been one field time elapsed between the setting and sampling of the ferroelectric capacitor 44A. During this time the trailing edge of the first chopper element has passed the x lines 98 and the element 44A has been flooded with the infrared energy from the scene and its capacitance has changed accordingly. The change in detector element capacitance forces a change in the voltage input to the buffer amplifier 108 proportional to the change in the capacitance because of the impinging radiation. it will be appreciated that the synchronization of the chopper position, i.e., from closed to open, can be reversed.

The timing and control circuit 20 (FIG. 1) generates the required signals for detector addresssing, display drive and chopper synchronization. There are a variety of ways in which this is accomplished. One approach is to use as the basic elements (1) an oscillator, (2) a high speed count down circuit clocked from the oscillator for pixel addressing and line rate signals, (3) a low speed count down for line addressing and field rate signal, and (4) a phase lock loop for synchronizing a mechanical chopper to the field rate signals. The display horizontal and vertical sweep signals are generated from the line and field signal, respectively.

Figure 13:
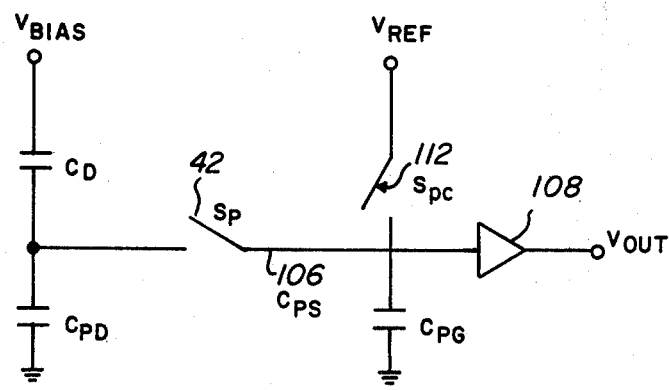
FIG. 13 is the electrical equivalent circuit of the detector mechanism embodiment of FIG. 11.

The magnitude of the change in voltage is derived from the electrical equivalent circuit of the system (FIG. 13). In this circuit the dual gated FET switch 42 is shown as a single pole switch $S_P$, the high speed precharge FET switch 112 as switch $S_{PC}$, the detector element capacitance as capacitor $C_D$, the precharge FET switch 112 parasitic capacitance and the amplifier input capacitance as $C_{PG}$, the detector element parasitic capacitance introduced by the bonding operation as $C_{PD}$, and the sense line 106 parasitic capacitance as $C_{PS}$. When the capacitors 44 of the ferroelectric detector 14 are precharged all switches are closed (C). The charge (Q(c)) on each of the capacitors is:

$$Q_D(c) = C_D(c)(V_{ref} - V_{bias})$$

$$Q_{PD}(c) = C_{PD} V_{ref}$$

$$Q_{PG}(c) = C_{PS} V_{ref}$$

The total charge $Q_T(c)$ is:

$$Q_T(c) = Q_D(c) + Q_{PD}(c) + Q_{PS}(c)$$

where $C_D(c)$ is the capacitance of the detector element when the chopper is closed.

The switches are then opened (o) and during the next field the high speed FET switch ($S_{PC}$) is closed and opened so that the parasitic capacitance $C_{PG}$ is reset to $C_{PS} V_{ref}$. The charge $Q_{PD}$ and $Q_D$ values have been held constant while the capacitance ($C_D$) on the detector element has changed from $C_D(c)$ to $C_D(o)$.

Next the FET switch $S_P$ is closed to allow the capacitances $C_D$, $C_{PD}$ and $C_{PG}$ to reach equilibrium to provide new voltage to the buffer amplifier 108. Mathematically this is:

$$Q_D(o) = C_D(o)(V_G - V_{bias})$$

$$Q_{PD}(o) = C_{PD} V_G$$

$$Q_{PS}(o) = C_{PS} V_G$$

with $Q_T(o) = Q_D(o) + Q_{PD}(o) + Q_{PS}(o)$
Now $Q_T(o) = Q_T(c)$
such that $$C_D(c)[V_{ref} - V_{bias}] + C_{PD} V_{ref} + C_{PS} V_{ref} = C_D(o)[V_G - V_{bias}] + C_{PD} V_G + C_{PS} V_G$$

$$V_G = [C_D(o) - C_C(c)] V_{bias} + [C(c) + C_{PD} + C_{PS}] V_{ref}/[C_D(o) + C_{PD} + C_{PS}]$$

The signal voltage is the change in the voltage at the amplifier input which is:

$$V_{sig} = V_G - V_{ref} = [C_D(o) - C_d(c)]V_{bias} + [C_D(c) + C_{DP} + C_{PS}] V_{ref} - [C_D(o) - C_{DP} + C_{PS}] V_{ref}/C_D(o) + C_{PD} + C_{PS}] = [C_D(c) - C_D(o)][V_{ref} - V_{bias}]/[C_D(o) + C_{PD} + C_{PS}]$$

The voltage signal ($V_{sig}$) is proportional to the change in capacitance resulting from the chopper opening and closing and is sensed by the video processor 18 and fed to the display 22 for that particular pixel element.

Before the switch ($S_p$) is opened, $S_{pc}$ is closed and opened. This action sets the detection element charge to:

$$Q_D(o) = C(o)[V_{ref} - V_{bias}].$$

Hence, in the next field when this element is addressed, the voltage signal ($V_{sig}$) will have the same magnitude for the same scene but of opposite sign. For this reason the video processor 18 contains a field-to-field phase reversal circuit. It will be recognized that resetting a capacitor, for example, 44A is equivalent to precharging the sense line 106 prior to reading the succeeding capacitor 44B. Thus, after the precharge switch 112 ($S_{pc}$) is opened switch 42A is opened and switch 42B is closed, allowing the signal to be displayed for capacitor 44B. This action sequence continues for the entire field.

An example of a field-to-field reversal circuit is as follows. A frame of information is comprised of two fields — one for chopper closed and one for chopper open. As stated the signal information has opposite polarity during the two fields. A set of signals corresponding to the field rate referenced as FLD and $\overline{\text{FLD}}$ is generated by the timing and control circuit. FLD will have a "high" level during chopper open and "low" level during chopper closed. The $\overline{\text{FLD}}$ signal has the opposite logical sense. The signal line video are fed to both the positive and negative inputs of an instrumentation amplifier and the signals are switched. The resulting video have consistent signs.

Referring now to the configuration of FIG. 12b, the double gates 58-58' of the switches 42 for addressing the ferroelectric capacitors 44 of the detector matrix 24 has been replaced by a single gate 58. Thus, when the row $x_1$ is addressed by the addressing circuit 95 each switch thereof is closed and the corresponding capacitor 44 is simultaneously connected to its sense line 106, precharge switch 112, and preamplifier 108. The outputs of each preamplifier 108 is connected to the input of the buffer amplifier 130 through their multiplexer switches 120. The gates 122 of the $y_1-y_n$ multiplexer switches are connected to outputs $y_1-y_n$ of the y addressing circuitry 94. The drains 124 of the multiplexer switches 120 are also connected by lead 126 to the drain of precharge FET switch 128 and buffer amplifier 130. Buffer amplifier 130 is connected by lead 132 to the video processor 18, which is connected to the display 22.

In operation, the precharge action is done at the x line scan rate, and the detector capacitors of each line now provide their information at the same time at the output of its amplifier 108. The lines of information are then multiplexed out through the buffer amplifier 130 by the y multiplexing switches 124. As in the configuration of FIG. 12a the y lines are cycled ON after each x line.

Referring now to FIG. 12c for a third configuration of the second embodiment of the ferroelectric imaging system. This configuration is a combination of the configurations of FIGS. 12a and 12b. In the third configuration the preamplifiers 108 and capacitors 118 of FIG. 12b have been omitted and the buffer amplifier 130, which is connected by lead 126 to the y address switches 124, acts also as the preamplifier.

Although several embodiments of this invention have been described herein, it will be apparent to a person skilled in the art that various other combinations and modifications to the details of construction shown and described may be made without departing from the scope of this invention.

What is claimed is:

1. An improved ferroelectric imaging system comprising:
    (a) a chopper for alternately interrupting infrared energy emanating from a scene;
    (b) a lens system for focusing the infrared energy emanating from a scene;
    (c) a ferroelectric detector matrix in the optical path of the lens system for receiving the alternating infrared energy, said ferroelectric detector matrix including a ferroelectric wafer, a layer of electrical conducting material covering substantially a first side of the ferroelectric wafer, busbars formed on the layer of electrical conducting material for connection to a biasing source of power for charging the layer of electrical conducting material, a plurality of electrical conducting pads arranged in rows and columns on a second side of the ferroelectric wafer, the plurality of electrical conducting pads forming a plurality of lower plates, said layer of electrical material, ferroelectric wafer, and plurality of electrical conducting pads forming a plurality of ferroelectric capacitors arranged in rows and columns;
    (d) a temperature controlled heat sink for maintaining the ferroelectric wafer substantially at its Curie temperature for operation;
    (e) a switching matrix comprising a plurality of solid state switches including a switch for each ferroelectric capacitor, a drive and read out electronics including a timing and control circuit for selectively opening and closing the plurality of solid state switches synchronously with the chopper action, a plurality of switch lines, said plurality of solid state switches connecting rows of the plurality of ferroelectric capacitors to the plurality of sense lines, said sense lines connected to a reference voltage and operative in response to selected switching action to read out signals representative of the infrared energy impinging on the ferroelectric capacitors, and at least one preamplifier for amplifying the electric signals;
    (f) a video processor operative in response to the amplified electrical signals for providing electrical signals in a display format; and
    (g) a display connected to the video processor for displaying the electrical signals representative of the infrared image of the scene.

2. An improved ferroelectric imaging system according to claim 1 wherein the switching matrix comprises a plurality of field effect transistor (FET) switches, each FET switch having a source, a drain, and first and second gates, said plurality of FET switches having their drains connected to the lower plates of the plurality of ferroelectric capacitors, their sources connected to the plurality of sense lines and their first gates connected in columns to a x addressing circuit of the drive and read out electronics, and their second gates connected in rows to a y addressing circuit of the drive and read out electronics.

3. An improved ferroelectric imaging system according to claim 1 wherein the switching matrix comprises a first plurality of field effect transistor (FET) switches arranged in rows and columns, said rows of FET switches having their drains connected to the lower plates of the ferroelectric capacitors and their sources connected to a sense line, and said columns of FET switches having their gates connected to a x addressing circuit of the drive and read out electronics, a second plurality of FET switches having their drains connected to a reference voltage, their gates connected to a low speed circuit of the timing and control circuit and their sources connected to the sense lines of the rows of FET switches, said second plurality of FET switches operative in response to timing signals for sequentially applying a voltage reference signal to the sense lines where it combines with the output of the ferroelectric capacitors for providing electrical signals representative of the infrared energy, and a third plurality of FET switches having their sources connected to the sense lines, their gates connected to a y address circuit of the drive and read out electronics, and their drains connected to a preamplifier, said third plurality of FET switches operative in response to the y addresses for selectively coupling the electrical signals representative of the infrared energy impinging on the ferroelectric capacitors to the preamplifier.

4. An improved ferroelectric imaging system according to claim 3 further including a plurality of amplifiers operatively connected to the outputs of the plurality of sense lines for amplifying the electrical signals representative of the infrared energy impinging on the ferroelectric capacitors prior to read out by the third plurality of FET switches.

5. A method of ferroelectric imaging comprising:
(a) biasing a plurality of ferroelectric capacitors of a ferroelectric detector matrix with a biasing voltage;
(b) closing a chopper to interrupt infrared energy emanating from a source;
(c) closing sequentially x address gates of rows of FET switches at a first rate of speed;
(d) closing sequentially y address gates of columns of FET switches at a second rate of speed, said second rate of speed being faster than the first to establish sequentially a low resistance path from the ferroelectric capacitors to a reference voltage switch;
(e) closing a reference voltage switch substantially simultaneously with the closing of the y address gates to charge sequentially the ferroelectric capacitors of the columns up to the reference voltage;
(f) opening the chopper to pass infrared energy emanating from the scene;
(g) opening sequentially the x address gates and the reference voltage whereby the capacitance of the ferroelectric capacitors is varied in proportion to the impinging infrared energy;
(h) closing and opening the x address gates simultaneously with the closing and opening of the voltage reference switch and interruption of the infrared energy impinging on the ferroelectric capacitors by the chopper to read out electrical signals proportional to the impinging infrared energy;
(i) amplifying the electrical signals to a working level for a video processor;
(j) processing the electrical signals in a video processor; and
(k) displaying the video signals to form a visible infrared image of the scene.

6. A method of ferroelectric imaging comprising:
(a) biasing a plurality of ferroelectric capacitors of a ferroelectric detector matrix with a biasing voltage;
(b) closing and opening a chopper to interrupt infrared energy emanating from a scene and impinging on the ferroelectric capacitors;
(c) closing, during the closing of the chopper, a plurality of first reference voltage switches and closing sequentially x address gates to close sequentially columns of the capacitor switches to charge sequentially columns of ferroelectric capacitors to a reference voltage;
(d) opening sequentially the x address gates to open sequentially columns of the capacitor switches during the opening of the chopper whereby the infrared energy impinging on ferroelectric capacitors acts to vary the capacitance in proportion to the intensity thereof for producing signal voltages representative of the impinging infrared energy;
(e) closing and opening sequentially the x address gates to close and open sequentially columns of the capacitor switches to provide a low impedance path from the ferroelectric capacitors to preamplifiers for the signal voltages;
(f) amplifying the signal voltages sequentially by columns;
(g) closing and opening sequentially the y address gates synchronously with a second voltage reference switch during x addressing of the columns of ferroelectric capacitors to read out the amplifier signal voltages;
(h) video processing the signal voltages into video signals; and
(i) displaying the video signals to produce a visible representation of the scene.

7. A method of ferroelectric imaging comprising:
(a) biasing a plurality of ferroelectric capacitors of a ferroelectric detector matrix with a biasing voltage;
(b) closing and opening a chopper to interrupt infrared energy emanating from a scene and impinging on the ferroelectric capacitors;
(c) closing, during the closing of the chopper, a plurality of first reference voltage switches and closing sequentially x address gates to close sequentially columns of capacitor switches to charge sequentially columns of ferroelectric capacitors of the ferroelectric detector matrix to a reference voltage;
(d) opening sequentially the x address gates to open sequentially columns of the capacitor switches during the opening of the chopper whereby the infrared energy impinging on the ferroelectric capacitors acts to vary the capacitance in proportion to the intensity thereof for producing signal voltages representative of the impinging infrared energy;
(e) closing and opening sequentially the x address gates to close and open sequentially columns of the capacitor switches to provide a low impedance path from the ferroelectric capacitors for the signal voltage representative of the impinging infrared energy;
(f) closing and opening sequentially the y address gates synchronously with a second voltage reference switch during the x addressing of the columns of ferroelectric capacitors to read out the signal voltages;
(g) video processing the signal voltages into video signals; and
(h) displaying the video signals to produce a visible representation of the scene.

* * * * *